United States Patent [19]
Darolia et al.

[11] Patent Number: 5,116,691
[45] Date of Patent: May 26, 1992

[54] DUCTILITY MICROALLOYED NIAL INTERMETALLIC COMPOUNDS

[75] Inventors: Ramgopal Darolia, West Chester; David F. Lahrman, Mason, both of Ohio

[73] Assignee: General Electric Company, Cincinnati, Ohio

[21] Appl. No.: 664,236

[22] Filed: Mar. 4, 1991

[51] Int. Cl.$^5$ .................. C22C 1/09; C22C 19/05
[52] U.S. Cl. .................. 428/614; 420/445; 420/450; 420/460; 148/404; 416/241 R; 415/200
[58] Field of Search .......... 428/614; 420/445, 450, 420/460; 416/241 R, 223 R; 415/200; 148/409, 410, 404, 428, 429

[56] References Cited

U.S. PATENT DOCUMENTS

| | | | |
|---|---|---|---|
| 2,884,688 | 5/1959 | Herz | 29/182 |
| 2,910,356 | 10/1959 | Grala et al. | 420/460 |
| 3,554,740 | 1/1971 | Williams et al. | 148/429 |
| 4,478,791 | 10/1984 | Huang et al. | 420/590 |
| 4,606,888 | 8/1986 | Huang et al. | 420/459 |
| 4,609,528 | 9/1986 | Chang et al. | 419/62 |
| 4,610,736 | 9/1986 | Barrett et al. | 148/429 |
| 4,612,165 | 9/1986 | Liu et al. | 420/459 |
| 4,613,368 | 9/1986 | Chang et al. | 75/246 |
| 4,613,480 | 9/1986 | Chang et al. | 419/30 |
| 4,668,311 | 5/1987 | Huang et al. | 148/429 |
| 4,676,829 | 6/1987 | Chang et al. | 65/246 |
| 4,710,247 | 12/1987 | Huang et al. | 148/429 |
| 4,725,322 | 2/1988 | Huang et al. | 148/429 |
| 4,731,221 | 3/1988 | Liu et al. | 420/445 |
| 4,743,315 | 5/1988 | Huang et al. | 148/429 |
| 4,743,316 | 5/1988 | Taub et al. | 148/429 |
| 4,764,226 | 8/1988 | Huang et al. | 148/429 |
| 4,915,903 | 4/1990 | Brupbacher et al. | 420/129 |
| 4,961,905 | 10/1990 | Law et al. | 420/460 |

OTHER PUBLICATIONS

Thaddeus B. Masalski, ed. Binary Alloy Phase Diagrams vol. 1, pp. 140–143, 1986.

"Mechanical Properties of Intermetallics at High Temperatures", (ASM/TMS Materials Week, Indianapolis 1989); G. Sauthoff; ASM/TMS Symposium on Intermetallics (1989).

Rapidly Solidified Lightweight Durable Disk Material, C. C. Law and M. J. Blackburn; AFWAL-TR-8-7-4102, Dec. 1987.

Intermetallic Phases as High-Temperature Materials; G. Sauthoff, 77 Z. Metallkde 654 (1986).

Intermetallic Phases—Materials Developments and Prospects, G. Sauthoff, 80 Z. Metallkde 337 (1989).

Slip System Modification in NiAl, D. Miracle, S. Russell and C. C. Law, 133 Mat. Res. Soc. Symp. Proc. 225 (1989).

Improving the Low Temperature Ductility of NiAl, S. Guha, P. Munroe, I. Baker, 133 Mat. Res. Soc. Symp. Proc. 633 (1989).

Investigations of NiAl and Ni$_3$Al, E. Grala, *Mechanical Properties of Intermetallic Compounds*, Ed. J. H. Westbrook.

Deformation Behavior of NiAl—Based Alloys Containing Iron, Cobalt and Hafnium, D. Pank, M. Nathal, D. Koss, 133 Mat. Res. Soc. Symp. Proc. 561 (1989).

Dislocation Creep in the Ordered Intermetallic (Fe, Ni) Al Phase, M. Rudy and G. Sauthoff, 81 Materials Science and Engineering 525 (1986).

*Primary Examiner*—R. Dean
*Assistant Examiner*—Margery S. Phipps
*Attorney, Agent, or Firm*—Carmen Santa Maria; Jerome C. Squillaro

[57] ABSTRACT

A NiAl nickel aluminide alloyed with yttrium, optionally gallium, and an element selected from the group consisting of chromium, molybdenum and combinations thereof, having improved room temperature ductility and plastic strain. NiAl nickel aluminide intermetallics alloyed with no more than about 5 atomic percent of additional elements have significantly improved room temperature ductility over conventional unalloyed beta phase nickel aluminides or beta phase nickel aluminides alloyed with higher percentages of additional elements. The NiAl nickel aluminide comprises, in atomic percent, at least 50% nickel, about 0.01% to about 0.25% yttrium, about 0 to about 0.15% gallium, about 0.05% to about 4% of an element selected from the group consisting of chromium, molybdenum and combinations thereof, and balance from about 40% to about 49.85% aluminum and trace impurities.

30 Claims, No Drawings

1

DUCTILITY MICROALLOYED NIAL INTERMETALLIC COMPOUNDS

CROSS REFERENCES TO RELATED APPLICATIONS

The following commonly assigned applications are directed to related subject matter and are being concurrently filed with the present application, the disclosures of which are incorporated herein by reference:

Ser. No. 664,152;
Ser. No. 664,246;

This invention relates to nickel aluminide alloys for use in aircraft gas turbine engines, and more particularly to beta phase NiAl nickel aluminide alloyed with chromium, molybdenum, yttrium and optionally gallium, for use in airfoil applications and turbine disk applications, operated at elevated temperatures in order to increase performance and efficiency.

FIELD OF THE INVENTION

The present invention relates to intermetallic compounds based on beta phase NiAl nickel aluminide alloyed with chromium, molybdenum, yttrium and optionally gallium.

BACKGROUND OF THE INVENTION

There is a constant demand for improved, lightweight high temperature materials for use in gas turbine engines typically used in aircraft. Much effort has been directed to superalloys based on iron, nickel and cobalt However, another area having a great amount of potential is that of intermetallic compounds.

Intermetallic compounds, frequently referred to simply as intermetallics, are compounds of metals having particular crystal structures which are different from those of the component metals. Intermetallics have ordered atom distribution. Although the bonding of intermetallics is still predominantly metallic bonding, making them less brittle than ceramics, they still tend to be brittle at ambient temperature. These ordered structures exist over specific composition ranges and exhibit high melting points while having the potential for good strength, despite having low ductilities or fracture toughnesses at ambient temperature. Typical intermetallics include TiAl, Ti$_3$Al, Ni$_3$Al and NiAl.

The NiAl system is of particular interest. It is particularly attractive for use as a turbine airfoil These airfoils typically are made from nickel base superalloys. However, NiAl intermetallics offer reduced density, up to 33% lower, and higher thermal conductivity, up to 300%, as compared to nickel base superalloys. However, the low ductility of NiAl intermetallics, less than 1% between room temperature and about 600° F., has impeded the implementation of NiAl intermetallics as a viable substitute for nickel base alloys.

Although many investigations have been directed to improvements and refinements in Ni$_3$Al, investigations into improvements in NiAl have been somewhat limited. For example, Liu et al., in U.S. Pat. Nos. 4,612,165 and 4,731,221, have investigated ductility improvements in Ni$_3$Al having less than 24.5% by weight of aluminum by additions of effective amounts of boron plus additions of 0.35 to 1.5% of hafnium, zirconium, iron and combinations thereof Similarly, Huang et al., in U.S Pat. No. 4,478,791, explored improvements in the ductility of Ni$_3$Al intermetallics by additions of small amounts of boron.

The NiAl intermetallic system has also been studied Most work has been directed to improving ambient temperature ductility of NiAl Law et al. in U.S. Pat. No. 4,961,905 have investigated improvements in the ductility and toughness of the intermetallic at low temperatures by adding at least 10 at.% cobalt in order to cause the formation of the L1$_0$ martensitic phase Rudy and Sauthoff, in their paper, "Creep Behaviour of the Ordered Intermetallic (Fe,Ni)Al Phase", Mat. Res. Soc. Symp. Proc., Vol. 39 (1985), discuss creep behavior of NiAl intermetallics containing at least 10 at.% iron, and conclude that the creep resistance of these brittle alloys is at a maximum at 10 at.% iron.

Law and Blackburn have studied the effects of gallium additions in poycrystalline NiAl. In their Final Air Force Report AFWAL-TR-87-4102 (December 1987) entitled "Rapidly Solidified Lightweight Durable Disk Material", gallium contents as low as 0.5% were added to beta NiAl, with no ductility improvements being observed in polycrystalline NiAl.

Barrett et al., U.S. Pat. No. 4,610,736, added small amounts of zirconium, 0.05% to 0.25% by weight, to NiAl to improve the cyclic oxidation resistance of NiAl as a coating. Grala et al. report in "Investigations of NiAl and Ni$_3$Al", Mechanical Properties of Intermetallic Compounds, (1960) that additions of 0.5% by weight molybdenum resulted in a heavy grain boundary precipitate, but lowered the brittle-ductile transition temperature of NiAl to room temperature, thereby improving ductility to about 1.9%.

It would be desirable if intermetallic compounds could be alloyed in a manner so as to improve the room temperature ductility of NiAl intermetallics, while maintaining the ordered atomic structure of the intermetallic, which contributes to such desirable characteristics as high temperature tensile strength, high melting point and excellent thermal conductivity.

SUMMARY

The alloys of the present invention are improved ductility NiAl nickel aluminides alloyed with small amounts of yttrium, optionally gallium and an element selected from the group consisting of chromium and molybdenum and combinations thereof. The alloys are beta phase intermetallics and yttrium, chromium, molybdenum and optionally gallium are included as alloying additions in these NiAl intermetallics having about equiatomic amounts of aluminum and nickel.

NiAl, containing from about 45 at% to about 59 at% Ni, forms a single phase intermetallic, referred to as the beta phase. This phase field exists up to its melting point, about 2950° F.–3000° F., although the compositional limits of the nickel and aluminum will vary slightly with temperature. In its broadest embodiment, the alloys of the present invention are beta phase NiAl intermetallics comprising, in atomic percent, at least about 48% nickel, about 0.01% to about 0.25% yttrium, optionally about 0.01% to about 0.15% gallium, about 0.05% to about 4% of an element selected from the group consisting of chromium and molybdenum and balance aluminum. The chromium and molybdenum may be present individually in an alloy or in combination, up to about 4%. A nickel aluminide intermetallic alloyed in accordance with the present invention displays improved room temperature ductility and plastic strain.

Because of the improved ductility, articles having the composition of the NiAl intermetallic of the present invention are suitable for use in turbine engine applications. The other favorable properties of these NiAl intermetallics, when coupled with this improved ductility make such articles suitable for use as turbine disks. In single crystal form, these articles are suitable for use as turbine airfoils. In the <110> direction, such articles prepared from these alloys display a room temperature plastic strain, in tension, of at least about 2%.

An advantage of the present invention is significantly improved room temperature ductility over conventional NiAl alloys not containing the combination of the elements of chromium or molybdenum, yttrium and optionally gallium. The alloys of the present invention display improved room temperature plastic strain over NiAl intermetallics having only one of the alloying elements of the present invention, or having the alloying elements of the present invention in atomic percentages greater than that contemplated by the present invention.

Another advantage of the alloy of the present invention is that it has a low density, about 0.210 lbs/in$^3$ making it very suitable for use as an airfoil or as a turbine disk in a turbine engine due to the significant decrease in density over current alloys.

Other advantages include excellent oxidation resistance and a simple ordered crystal structure, the crystal structure being a body-centered cubic crystal structure of the CsCl type, having potentially easier plastic deformation as compared to other intermetallic compounds. Oxidation resistance may be further increased by the addition of small amounts of zirconium, for example, 0.1 at.%.

The term "balance essentially aluminum" as used herein, includes in addition to aluminum in the balance of the alloy, small amounts of impurities and incidental elements, which in character and/or amount do not adversely affect the advantageous aspects of the alloy. These impurities are generally present in amounts less than 100 ppm each. Typical impurities include carbon, from 15 to 60 ppm; oxygen, from 40 to 100 ppm; sulphur, from about 1 to about 2 ppm; boron, from about 5 to about 6 ppm; and nitrogen, from about 1 to about 3 ppm. Other impurities may include silicon, copper and cobalt.

As used herein, yield strength ("Y.S.") is the 0.2% offset yield strength corresponding to the stress required to produce a plastic strain of 0.2% in a tensile specimen that is tested in accordance with ASTM Specification E8 ("Standard Methods of Tension Testing of Metallic Materials," Annual Book of ASTM Standards, Vol. 03.01, pp. 130-150, 1984) or equivalent method. The term ksi represents a unit of stress equal to 1,000 pounds per square inch. Plastic strain is defined as inelastic strain prior to failure in tension at room temperature when tested in accordance with ASTM Specification E8.

The intermetallics of the present invention may also be processed by any suitable single crystal growth method that does not result in excessive impurities, which would otherwise affect the mechanical properties. The intermetallics of the present invention may be used to fabricate airfoils for use in gas turbine engines. These airfoils include both rotating compressor blades and turbine blades mounted on turbine disks as well as static vanes.

Other features and advantages of the present invention will be apparent from the following more detailed description of the preferred embodiment which illustrate the principles of the invention.

DETAILED DESCRIPTION OF THE INVENTION

Pursuant to the present invention, beta phase NiAl intermetallics alloyed with yttrium, and chromium or molybdenum and optionally gallium having improved room temperature ductility and plastic strain are disclosed. The preferred NiAl intermetallics are single crystals, comprising, in atomic percent, at least about 48% nickel, about 0.01% to about 0.25% yttrium, up to about 0.15% gallium and about 0.05% to about 4% of an element selected from the group consisting of chromium, molybdenum and combinations of chromium and molybdenum and balance aluminum. However, the total quantity of elements in the NiAl intermetallic, apart from nickel and aluminum, should not exceed more than about 5 atomic percent. Furthermore, these intermetallics are characterized by a room temperature plastic strain, in tension, of at least about 2%. These unexpectedly high plastic strain values are associated with the relatively small quantities of alloying elements, in accordance with the present invention, the plastic strain values at room temperature decreasing with increasing elemental additions to the NiAl. Surprisingly, the combination of alloying elements in the proportions of the present invention produces improved plastic strain values than when the alloying elements are present as ternary additions, and not present in combination.

One of the potential applications of the intermetallic alloys of the present invention is as a turbine disk for a gas turbine engine. Another potential application of the intermetallic alloys of the present invention is, in single crystal form, as airfoils for a gas turbine engine Among the advantages of NiAl is low density The NiAl intermetallic of the present invention has a density of 0.210 lbs/in$^3$. This density is about two thirds of the density of current nickel base superalloys. This lower density results in a lighter part. For example, when the airfoil is a rotating turbine blade, not only is the weight of the turbine blade reduced by the use of a NiAl intermetallic, but the weight of the turbine disk is also reduced due to the lower stresses on the disk.

The thermal conductivity of the NiAl of the present invention also represents an improvement over the thermal conductivity of superalloys currently employed This property is important when the part is used at elevated temperatures, for example, as a high pressure turbine blade. The improved thermal conductivity permits better heat distribution and eliminates potential life limiting hot spots.

The NiAl nickel aluminide intermetallic of the present invention is a simple ordered structure based on body centered cubic (bcc) structure, with nickel located at the corners, and aluminum located at the body-centered site. For the intermetallics of the present invention, the alloying elements generally have been substituted for aluminum. However, when the solubility limit of chromium or molybdenum in NiAl is reached, alpha-chromium or alpha-molybdenum will be precipitated throughout the beta phase. The solubility limit at room temperature of chromium in the beta phase is about 1 atomic percent, and the solubility limit of molybdenum in the beta phase is about 0.1 atomic percent. Thus, for stoichiometric NiAl, it is believed that the addition of the alloying elements result in the replacement of Al in the structure.

The alloys of the present invention were produced by combining high purity elemental material in the appropriate amounts and by induction melting under an argon atmosphere. The induction melted charge is then remelted in a directional solidification furnace under an argon atmosphere to prevent the vaporization of Al, and solidified as single crystals using the well-known Bridgman Withdrawal Process, although any other single crystal growth process may be used.

Impurities were maintained at low levels, measured in parts per million ("ppm"), so that their presence may be characterized as trace. These trace elements were generally interstitial elements such as oxygen, nitrogen, carbon, sulphur and boron, and are present in amounts of less than 100 ppm by weight of each impurity. Silicon is present up to as high as 1000 ppm.

The examples set forth below are illustrative of compositions within the scope of the present invention.

EXAMPLE 1

A NiAl intermetallic having a nominal composition, in atomic percent, of at least about 50% nickel, about 1% chromium, about 0.1% yttrium and the balance essentially aluminum, was prepared by the methods described above. The composition of this alloy, including a melt tolerance for each element, was about 0.5 to about 1.5% chromium, about 0.05% to about 0.15% yttrium, at least about 50% nickel and the balance essentially aluminum. A single crystal alloy of this nominal composition has a room temperature plastic strain of about 2.97% in the <110> direction. This plastic strain is a significant improvement over the 0.21% plastic strain of a NiAl intermetallic having the same nominal composition, but with no yttrium.

EXAMPLE 2

A NiAl intermetallic having a nominal composition, in atomic percent, of at least about 50% nickel, about 0.1% molybdenum, about 0.05% gallium about 0.1% yttrium and the balance essentially aluminum, was prepared by the methods described above. The composition of this alloy, including a melt tolerance for each element, was about 0.05% to about 0.15% molybdenum, about 0.05% to about 0.15% yttrium, about 0.01% to about 0.15% gallium, at least about 50% nickel and the balance essentially aluminum. A single crystal alloy of this nominal composition has a room temperature plastic strain of about 3.53% in the <110> direction. This plastic strain is a significant improvement as compared to the plastic strain of NiAl ternary alloys containing only one of the alloying elements.

EXAMPLE 3

A NiAl intermetallic having a nominal composition, in atomic percent, of at least about 50% nickel, about 0.1% molybdenum, about 0.1% gallium about 0.1% yttrium and the balance essentially aluminum, is prepared by the methods described above. The composition of this alloy, including a melt tolerance for each element, is about 0.05% to about 0.15% molybdenum, about 0.05% to about 0.15% yttrium, about 0.05% to about 0.15% gallium, at least about 50% nickel and the balance essentially aluminum. A single crystal alloy of this nominal composition will have a room temperature plastic strain above at least 2%, in the range of about 3% to about 3.5%, in the <110> direction.

EXAMPLE 4

A NiAl intermetallic having a composition, including a melt tolerance for each element in atomic percent, of at least about 50% nickel, about 0.05% chromium to about 4% chromium, about 0.01% to about 0.25% yttrium, optionally up to about 0.15% gallium and the balance essentially aluminum, is prepared by the methods described above. Preferably, the chromium is present in an amount from about 0.5% to about 1.5%. The gallium, although optional, is also preferably present in an amount from about 0.05% to about 0.15%. A single crystal alloy having such a composition will have a room temperature plastic strain, in tension, above about 2% in the <110> direction, and a room temperature plastic strain above about 3% in the preferred composition range.

Single crystal intermetallic NiAl alloys alloyed with the elements prepared in accordance with the present invention unexpectedly display unusually high room temperature plastic strain in the <110> direction. Although it has recently been discovered that other elements individually microalloyed with NiAl produce plastic strains in excess of about 1.5%, the combination of alloying elements in the present invention retains the exceptional plastic strain behavior at higher elemental concentrations than when present individually. The combination of alloying elements of this invention displays exceptional plastic strain behavior extending over broader compositional ranges than when the individual elements are added as ternary additions to NiAl.

In addition to improved ductility, the fracture toughness of the intermetallics of the present invention also improves. The fracture toughness is also anisotropic, and also increases with increasing temperature due to increased plasticity at the tip of the growing crack.

The improved room temperature ductility of the NiAl intermetallics alloyed in accordance with the present invention, particularly in the preferred and most preferred compositional ranges, make them attractive substitutes for nickel base superalloys in articles for turbine engines such as disks, in polycrystalline form, and single crystal airfoils for turbine applications.

The alloys of the present invention are also suitable for use in reinforced intermetallic matrix composite articles, wherein the intermetallic alloys of the present invention form the matrix. For example, an alloy consisting essentially of, in atomic percent, about 0.01% to about 0.25% yttrium, optionally up to about 0.15% gallium, about 0.05% to about 4% of an element selected from the group consisting essentially of molybdenum and chromium, at least about 50% nickel and the balance essentially aluminum is the matrix of a fiber containing composite article.

In light of the foregoing discussion, it will be apparent to those skilled in the art that the present invention is not limited to the embodiments and compositions herein described. Numerous modifications, changes, substitutions and equivalents will now become apparent to those skilled in the art, all of which fall within the scope contemplated by the invention herein.

What is claimed is:

1. A NiAl intermetallic alloy comprising, in atomic percent, at least about 50% nickel, about 0.01% to about 0.25% yttrium, about 0 to about 0.15% gallium and about 0.05% to about 4% of an element selected from the group consisting of chromium and molybdenum and combinations of chromium and molybdenum, and balance from about 40% to about 49.85% aluminum and trace impurities.

2. A NiAl intermetallic article having the composition of claim 1.

3. The article of claim 2 wherein the article is a turbine disk for a turbine engine.

4. The article of claim 2 wherein the article is a single crystal article.

5. The article of claim 4 wherein the article is an airfoil for a turbine engine.

6. The NiAl intermetallic article of claim 4 further characterized by a room temperature plastic strain, in tension, of at least about 2%.

7. A NiAl intermetallic alloy comprising, in atomic percent, at least about 50% nickel, about 0.01% to about 0.25% yttrium, about 0 to about 0.15% gallium and about 0.05% to about 4% chromium and balance from about 40% to about 49.85% aluminum and trace impurities.

8. A NiAl intermetallic article having the composition of claim 7.

9. The article of claim 8 wherein the article is a turbine disk for a gas turbine engine.

10. The article of claim 8 wherein the article is a single crystal article.

11. The article of claim 10 wherein the article is an airfoil for a turbine engine.

12. The NiAl intermetallic article of claim 10 further characterized by a room temperature plastic strain of at least about 2%.

13. A NiAl intermetallic alloy consisting essentially of, in atomic percent, about 0.01% to about 0.25% yttrium, about 0 to about 0.15% gallium, about 0.5% to about 1.5% chromium, at least about 50% nickel and the balance essentially aluminum.

14. A NiAl intermetallic article having the composition of claim 13.

15. The article of claim 14 wherein the article is a turbine disk for a turbine engine.

16. The article of claim 14 wherein the article is a single crystal article.

17. The article of claim 16 wherein the article is an airfoil for a turbine engine.

18. The NiAl intermetallic article of claim 16 further characterized by a room temperature plastic strain, in tension, of at least about 2%.

19. The NiAl intermetallic alloy of claim 13 wherein the atomic percent of gallium is from about 0.05% to about 0.15%.

20. A NiAl intermetallic alloy consisting essentially of, in atomic percent, about 0.05% to about 0.15% molybdenum, about 0.01% to about 0.15% gallium, about 0.05% to about 0.15% yttrium, at least about 49% nickel and the balance essentially aluminum.

21. A NiAl intermetallic article having the composition of claim 20.

22. The article of claim 21 wherein the article is a turbine disk.

23. The article of claim 21 wherein the article is a single crystal article.

24. The article of claim 23 wherein the article is an airfoil for a turbine engine.

25. The article of claim 23 further characterized by a room temperature plastic strain, in tension, of at least about 2%.

26. A NiAl intermetallic alloy consisting essentially of a nominal composition, in atomic percent, of at least about 50nickel, about 1% chromium, about 0.1% yttrium and the balance essentially aluminum.

27. A NiAl intermetallic alloy consistently of a nominal composition, in atomic percent, of at least about 50% nickel, about 0.1% molybdenum, about 0.05% gallium, about 0.1; % yttrium, and the balance essentially aluminum.

28. A NiAl intermetallic alloy having a nominal composition, in atomic percent, of at least about 50% nickel, about 0.1% molybdenum, about 0.1% gallium, about 0.1% yttrium, and the balance essentially aluminum.

29. A reinforced intermetallic matrix composite article, comprising fiber within a NiAl intermetallic alloy matrix, the intermetallic matrix consisting essentially of, in atomic percent, about 0.01% to about 0.25% yttrium, about 0 to about 0.15% gallium, about 0.05% to about 4% chromium, at least about 50% nickel and the balance essentially aluminum.

30. A single crystal NiAl intermetallic alloy comprising, in atomic percent, at least about 50% nickel, about 0.01% to about 0.25% yttrium, about 0 to about 0.15% gallium and about 0.05% to about 4% of an element selected from the group consisting of chromium and molybdenum and combinations of chromium and molybdenum, the total of additional elements comprising no more than about 5% of the NiAl intermetallic, the intermetallic being further characterized by a room temperature plastic strain, in tension, of at least about 2%.

* * * * *